United States Patent [19]

Branham

[11] 4,297,639

[45] Oct. 27, 1981

[54] BATTERY TESTING APPARATUS WITH OVERLOAD PROTECTIVE MEANS

[76] Inventor: Tillman W. Branham, Rte. 1, Box 149, Lugoff, S.C. 29078

[21] Appl. No.: 58,687

[22] Filed: Jul. 18, 1979

Related U.S. Application Data

[63] Continuation-in-part of Ser. No. 969,066, Dec. 13, 1978, abandoned.

[51] Int. Cl.³ .......................................... G01N 27/42
[52] U.S. Cl. .................................... 324/429; 324/428
[58] Field of Search ............................... 324/425–429, 324/434

[56] References Cited

U.S. PATENT DOCUMENTS

| | | | |
|---|---|---|---|
| 1,882,581 | 10/1932 | Haskins . | |
| 1,907,682 | 5/1933 | Taylor . | |
| 2,229,009 | 1/1941 | Berry . | |
| 2,632,793 | 3/1953 | Linn . | |
| 3,876,931 | 4/1975 | Godshalk | 324/429 |
| 3,899,732 | 8/1975 | Staby | 324/429 |
| 3,969,667 | 7/1976 | McWilliams | 324/427 |
| 4,080,560 | 3/1978 | Abert | 324/429 |
| 4,193,026 | 3/1980 | Finger | 324/428 |

*Primary Examiner*—Michael J. Tokar
*Attorney, Agent, or Firm*—Bell, Seltzer, Park & Gibson

[57] ABSTRACT

An apparatus for testing storage batteries under no-load and load conditions is provided which limits the duration of a test of any battery having adequate charge capacity and thereby protects both the apparatus and the battery from the hazards of excessive current. The battery testing apparatus includes a load circuit having current responsive switch means that automatically opens when its predetermined amperage rating is exceeded to provide a load test having a duration corresponding to the reaction time of the switch means. A voltage indicator, including a lamp or a voltmeter, detects and indicates the relative magnitude of the voltage available between the terminals of the battery so that the charge capacity of the battery can be determined both under no-load and load conditions. An ammeter may be also included for measuring the current passing through the load circuit during the load test.

11 Claims, 7 Drawing Figures

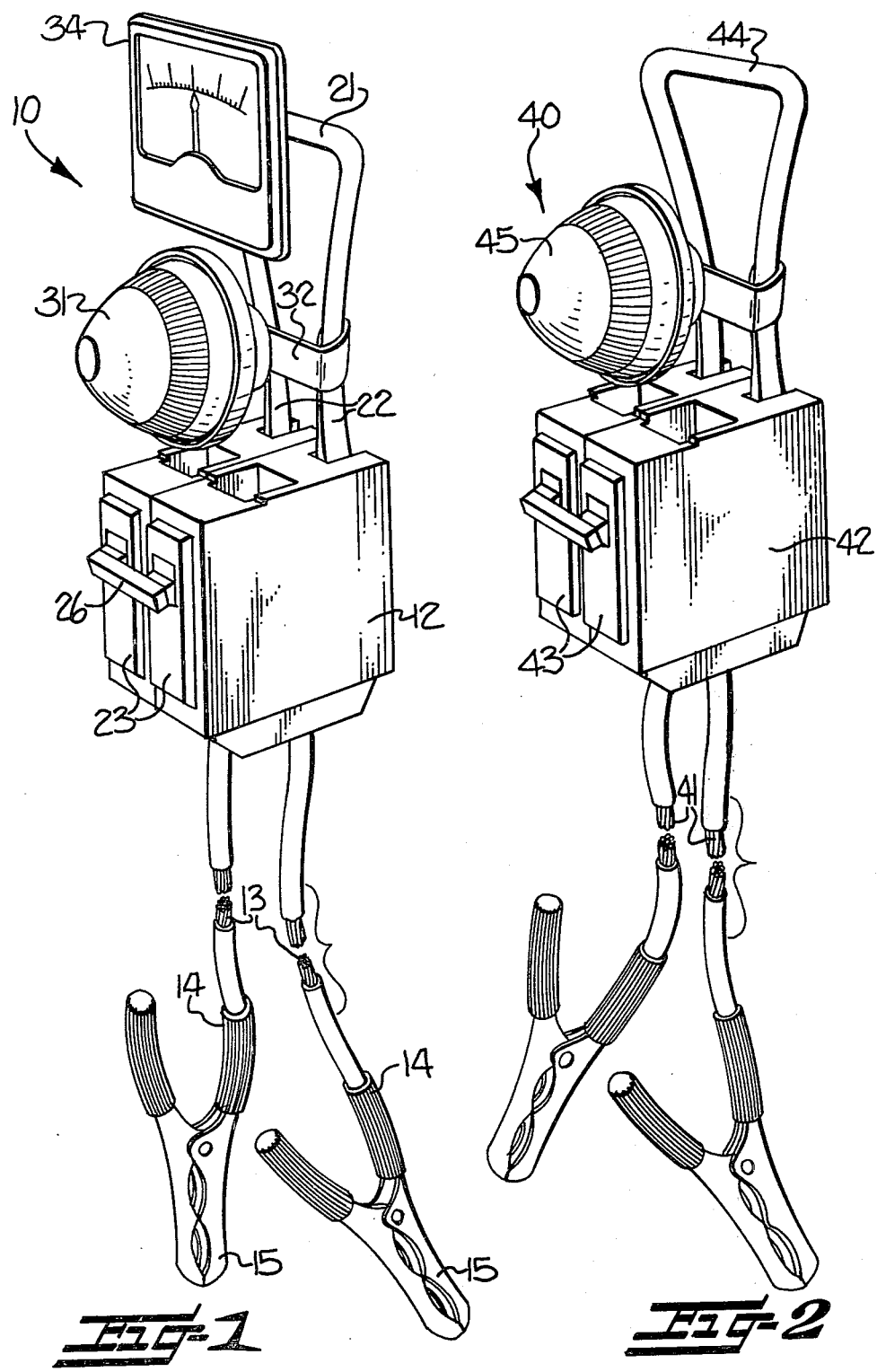

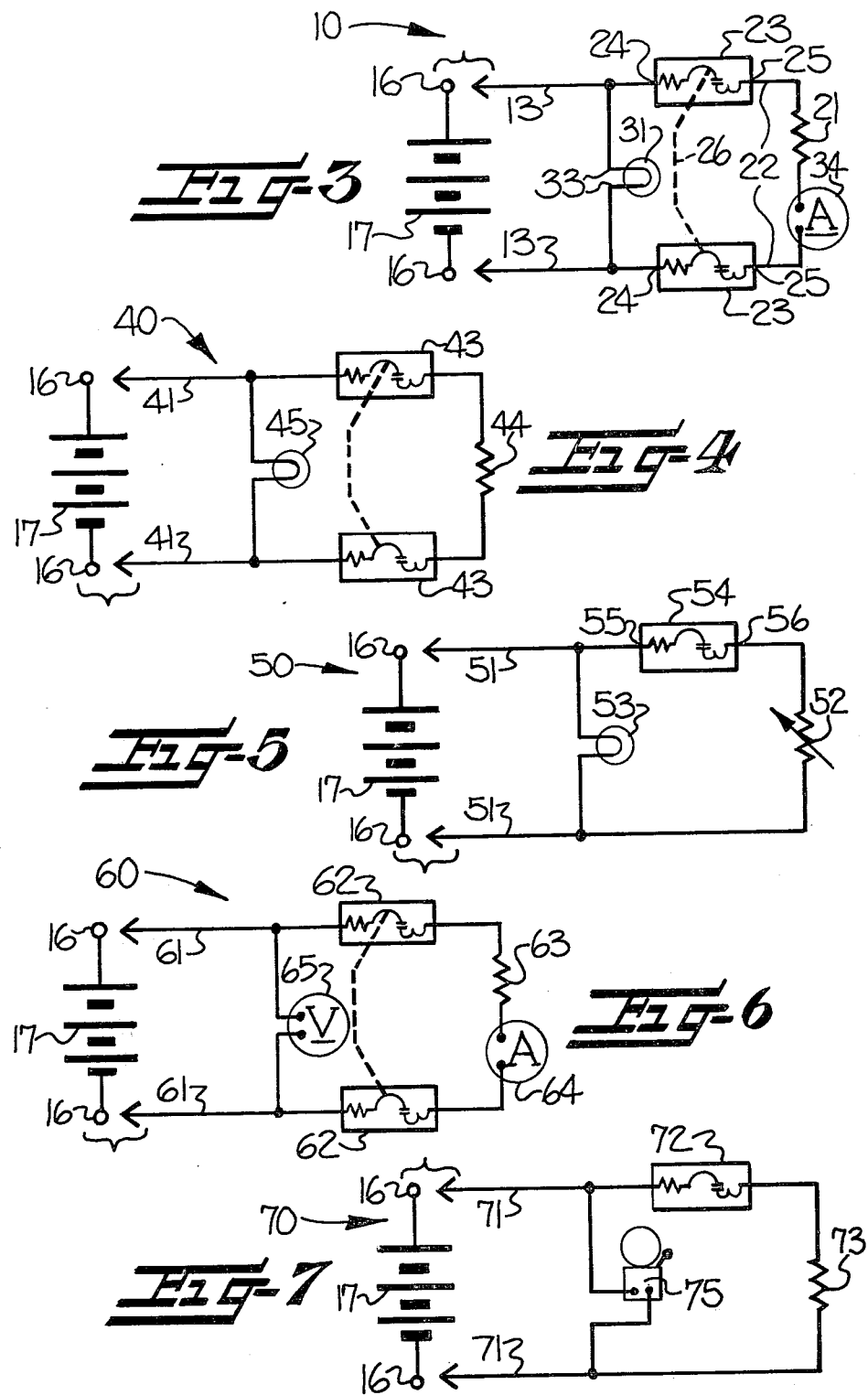

BATTERY TESTING APPARATUS WITH OVERLOAD PROTECTIVE MEANS

This application is a continuation-in-part of copending application Ser. No. 969,066, filed Dec. 13, 1978, and entitled BATTERY TESTER, and now abandoned.

FIELD OF THE INVENTION

The present invention relates to an apparatus for testing storage batteries, particularly those of the wet cell type commonly used in ignition systems for motor vehicles or the like. More specifically, the invention concerns a testing apparatus for testing a battery under both no-load and load conditions, so that the condition of the battery and its capacity to deliver adequate voltage can be observed, while providing overload protection for both the battery and the testing apparatus.

BACKGROUND OF THE INVENTION

In a variety of electrical systems such as, for example, ignition systems for gasoline engines, emergency lighting systems, marine power systems, portable television sets and radio receivers, storage batteries have been employed to retain and store electrical energy for subsequent use. In their most common applications, storage batteries, also known as electric accumulators or secondary batteries, have been utilized in motor vehicles to provide power for starting the engine and for operating accessory equipment such as lights, radios and the like. Storage batteries usually provided for this use are of the lead-acid type that include an assembly of voltaic cells connected in series and which operate by a reversible electrochemical action. In this manner, the battery can be recharged by passing a current through the cells in the opposite direction to that of discharge, and for that purpose an alternator is usually provided on the motor vehicle.

Because of the electrochemical action and certain structural deficiencies within storage batteries, problems frequently develop that prevent operation or impair performance of the battery. To test a battery's condition, a suitable indicator may be connected to the terminals and a determination made of the relative magnitude of the voltage capability of the battery. This test, however, will demonstrate only short circuits within the battery, or insufficient voltage capacity under a no-load condition; that is, when very little, if any, current is being drawn from the battery. This test is incapable of determining the charge capacity or the ability of the battery to provide an adequate and substantially stable voltage while discharging a large current over a period of time. Thus, merely measuring the voltage capability under no-load conditions is generally considered inadequate for testing a battery's operability.

In an attempt to more effectively test a battery's operability, it has previously been proposed to provide battery testing devices capable of testing a storage battery under load conditions. One example of such a testing device is disclosed in U.S. Pat. No. 1,907,682 to Taylor. However, the testing device of the Taylor patent is only capable of testing batteries under load conditions; i.e., it is incapable of testing batteries under both no-load and load conditions.

Testing devices capable of testing batteries under both no-load and load conditions have also been proposed heretofore, as disclosed, for example, in U.S. Pat. No. 1,882,581 to Haskins. However, testing devices of a type similar to that disclosed in the Haskins patent have provided no limitation upon either the duration of the test or the magnitude of current drawn from the battery during the test. As is well known in the battery testing art, if a test is conducted for too long a period, damage to the battery may result even if only normal current is drawn from the battery. Further, if abnormally high current is drawn from the battery during the test, there is danger of the battery exploding or of other damage to the battery or the testing apparatus.

There have been certain attempts to overcome these hazards, but such attempts have not provided an adequate solution. One such previous attempt is characterized by providing a limitation upon the time period within which the test was conducted. Such a testing device is disclosed in U.S. Pat. No. 2,632,793 to Linn which discloses a testing device having a timer controlled switch in the load circuit. While providing some control over the time period of the test, the device of the Linn patent does not provide any protection to the battery or the testing device against abnormally high current. Further, the time period of the test is entirely preset with the device of the Linn patent and there is no provision for variance of the time period which is desirable in some instances to accommodate particular conditions encountered during a test.

Another such previous attempt is characterized by providing protection to the testing device against abnormally high current, but as far as is known, such attempt provided neither protection to the battery nor any control over the duration of the test. An example of such a testing device is disclosed in U.S. Pat. No. 2,229,009 to Berry.

SUMMARY OF THE INVENTION

With the foregoing in mind, it is an object of the present invention to provide a battery testing apparatus which overcomes the aforementioned deficiencies of prior testing devices by controlling the duration of the test period and by protecting both the battery being tested and the testing apparatus.

This object is accomplished by providing a battery testing apparatus which comprises voltage indicator means, a load circuit in parallel with the voltage indicator means, and cable means electrically connected to the voltage indicator means and adapted to be connected to the electrodes of a storage battery. The voltage indicator means detects the voltage available between the electrodes of the battery and indicates the relative magnitude of the voltage. The load circuit includes a load resistor, and current responsive switch means connected in series with the load resistor and operable for opening and closing the load circuit. The current responsive switch means has a predetermined amperage rating and is operable to open the load circuit when the current passing through the load circuit exceeds that predetermined amperage. The predetermined amperage rating of the current responsive switch means and the resistance of the load resistor are correlated to each other and to a predetermined level of battery capability such that any test of a battery having a capability at or above this predetermined level of capability will result in a current in the load circuit exceeding the amperage rating of the current responsive switch means, thus opening the load circuit.

In operation, when the voltage indicator means and load circuit are connected to the electrodes of the battery, the current responsive switch means normally is open so that the relative magnitude of the voltage of the battery under no-load conditions may be determined by reference to the voltage indicator. The current responsive switch means is then closed so that a current passes through the load circuit. The relative magnitude of the voltage of the battery under a load condition can then again be determined by reference to the voltage indicator and until such time as the current passing through the load circuit exceeds the predetermined amperage rating of the current responsive switch means, whereupon the load circuit is opened by the switch means. In this manner, tests of batteries having a desired high electrical potential, i.e., batteries having a voltage capability at or above the predetermined level of capability, and which are subject to the aforementioned hazards, are limited in duration to the reaction time of the current responsive switch means so that both the battery and testing apparatus are protected from excessive current.

BRIEF DESCRIPTION OF THE DRAWINGS

Some of the objects and advantages of the invention having been stated, others will appear as the description proceeds, when taken in connection with the accompanying drawings, in which FIG. 1 is a perspective view of a battery testing apparatus embodying the features of the present invention;

FIG. 2 is a perspective view of a modified form of the present invention;

FIG. 3 is an electrical circuit diagram of the battery testing apparatus illustrated in FIG. 1;

FIG. 4 is an electrical circuit diagram of the battery testing apparatus illustrated in FIG. 2;

FIG. 5 is an electrical circuit diagram of another modified form of the present invention;

FIG. 6 is an electrical circuit diagram of a further modified form of the present invention and illustrating the provision of a voltmeter for detecting and indicating voltage; and FIG. 7 is an electrical circuit diagram of still another modified form of the present invention and illustrating the provision of means, such as a bell or buzzer, for detecting and audibly indicating voltage.

DETAILED DESCRIPTION

Referring more specifically to the drawings, the embodiment of the battery testing apparatus illustrated in FIGS. 1 and 3 is indicated generally at 10, and includes a transportable housing 12 to which a pair of battery cables 13 are connected at corresponding ends, not shown. At the other corresponding ends 14 of the battery cables 13, clamps 15 are connected for coupling the cables to respective terminals 16 of a storage battery 17 (FIG. 3). The clamps 15 are of the type commonly used for temporary attachment of cables to battery terminals and permit rapid connection and removal of the battery testing apparatus to facilitate testing of a number of batteries in succession.

A metallic generally U-shaped handle which conveniently serves as a load resistor 21, is also provided and is mounted to the housing 12 so that the apparatus 10 can be conveniently transported. The load resistor 21 is illustrated as comprising a predetermined length of metal tubing having a relatively low resistance and has end portions 22 respectively connected to the ends of the cables 13 that are connected to the housing 12. Thus, as further explained below, the load resistor 21 is within a series load circuit running between the terminals 16 of the battery 17, as shown in FIG. 3.

In accordance with this invention, if a battery being tested is in "good" condition, the current applied to the load resistor 21 by the battery may reach and preferably exceed a predetermined current level, and when such current level is reached or exceeded, the circuit to the load resistor is interrupted, since otherwise, the battery and/or the testing apparatus might be damaged due to the overload thereon.

Accordingly, in order to permit manual closing of the circuit to the load resistor 21 of the testing apparatus and to effect interruption of the circuit when the predetermined current level is exceeded, the housing 12 comprises a current responsive switch means 23 which is connected in series in the load circuit. Preferably, the switch means 23 comprises at least one circuit breaker having a predetermined amperage rating. It has been determined that circuit breakers of the type commonly used for household or industrial circuits, and which are readily available from electrical equipment manufacturers, may be used.

The switch means 23 in the embodiment shown in FIGS. 1 and 3 comprises a pair of side-by-side circuit breakers, each of which has first and second terminals 24 and 25. Each of the first terminals 24 is connected to a respective one of the cables 13 so as to be connected respectively to the positive and negative terminals 16 of the battery 17. The second terminals 25 are connected to the end portions 22 at the opposite ends of the load resistor 21. Preferably, circuit breakers 23 are interconnected or ganged by a switch connector 26 so that both breakers will be simultaneously opened and simultaneously closed.

In accordance with this invention, both the resistance of load resistor 21 and the amperage rating of the circuit breakers 23 are correlated to each other and to the current that will flow through the load circuit during the testing of a battery having a charge capability at a predetermined level. This correlation is made in such a manner that the current passing through the load circuit of the testing apparatus will exceed the predetermined amperage rating of the circuit breakers 23 during all tests of "good" batteries or those batteries having an acceptable charge capability. Therefore, the circuit breakers 23 will automatically open during any test of a "good" battery and will remain closed during any test of an unacceptable or "bad" battery.

In addition, circuit breakers 23 are selected to have a predetermined reaction time, which is the time period required for the circuit breaker to open once the current exceeds its amperage rating. Thus, the duration of a test of a "good" battery can be controlled within limits imposed by potential hazards. Since only the testing of "good" batteries involve potential hazards, such limitation upon the duration of such tests protects both the testing apparatus and the battery being tested from the potentially harmful effects of excessive current, excessive test duration and explosion.

To observe the condition of the battery 17 and its capacity to deliver adequate voltage, voltage indicator means is provided for detecting the voltage available between the terminals 16 of the battery 17 and for indicating the relative magnitude of the voltage. In the embodiment shown in FIGS. 1 and 3, the voltage indicator means comprises a lamp 31 mounted to the load resistor 21 by means of a bracket 32. The lamp 31 is responsive to voltages within the range of voltages of the storage batteries to be tested and is of the type that emits light proportionately to the voltage supplied by the battery. Furthermore, the lamp 31 has electrical terminals 33 so that it can be connected to the terminals 16 of the battery 17 and in parallel with the load circuit.

Additional information concerning the operability of the storage battery 17 can be provided by the inclusion of an ammeter 34 connected in series with the load resistor 21 and switch means 23. As shown in FIG. 1, the ammeter 34 is conveniently mounted to the load resistor 21 and is of the reversible polarity type so that current can pass through the ammeter in either direction. By means of the ammeter 34, the current passing through the load circuit can be determined during testing under load conditions.

In operation, the switch means 23 of the battery testing apparatus 10 is placed in an open or "off" position and the cables 13 are connected to the terminals 16 of the battery 17 by clamps 15. Since a lamp 31 is employed in this embodiment as the voltage indicator means and since the ammeter 34 has reversible polarity, either cable 13 may be connected to the positive terminal of the battery, and the other cable is connected to the remaining negative terminal. Thus, connection of the apparatus 10 is convenient since the cables are not associated with particular positive or negative terminals.

When the connection of the cables 13 is complete, and with the switch means 23 open, the relative magnitude of the voltage under no-load conditions is determined by observing the light emitted from the lamp 31. Full illuminance will indicate operability of the storage battery 17, while no or little light will indicate problem conditions, such as short circuits, within the battery.

To test the battery 17 under load conditions, the switch means 23 is closed or placed in an "on" position, which allows current to pass through the load circuit. A low amperage will pass through the lamp 31 so as to indicate the voltage of the battery, but the relatively high inherent internal resistance of the lamp and the low resistance of the load resistor 21 cause most of the current to pass through the load resistor. Thus, substantial current is drawn from the battery and the voltage condition under such load conditions may be observed from the lamp 31 until such time as the switch means 23 automatically opens. If the battery 17 has insufficient current capacity the predetermined amperage rating of the switch means 23 will not be exceeded and the switch means will not automatically open. Thus, the lamp 31 will dim during the load test, indicating that the battery is in poor condition and unable to deliver adequate current. However, if the battery is fully charged and has adequate charge capacity, the amperage rating of the switch means 23 will be exceeded and the switch means will open. Under these conditions, the lamp 31 will be observed to emit light to its full brightness, indicating the good condition of the battery. The amperage discharged from the battery while under the load can also be determined from the ammeter 34.

In one prototype testing apparatus of the present invention, the apparatus 10 included a load resistor 21 consisting of 12 inches of copper tubing, and the switch means 23 was composed of a pair of circuit breakers, each of which had an amperage rating of 100 amps. In the testing of automobile batteries with 12 volt capacity using this particular arrangement, currents in excess of 700 amps have been drawn through the load circuit. When drawn through the load circuit during a test of a "good" battery, this current will cause the circuit breakers to automatically open within a few seconds after the circuit breaker is closed. With current of this magnitude, the amperage rating of the circuit breakers may be varied to vary the reaction time and thereby either shorten or lengthen the test period or duration.

It is contemplated that the battery testing apparatus 10 may be used for warming a battery that has been subjected to extremely cold conditions so as to bring the charge capability of the battery up to its operable level. By connecting the apparatus in the manner described above and by closing the switch means 23, a large current is drawn from the battery within a short period of time. Thereby, the rate of the chemical reactions within the cells of the battery is increased, and greater charge capacity from the battery is made available.

FIGS. 2 and 4 illustrate a modified form of the battery testing apparatus, which basically corresponds to the battery testing apparatus 10 shown in FIGS. 1 and 3 except in the absence of an ammeter. By eliminating the ammeter, there is a substantial economic savings in manufacture and reduction of cost of the apparatus. This form of the battery testing apparatus, indicated generally at 40, includes cables 41 and switch means 43 mounted to a housing 42. A load resistor 44 and lamp 45 are also provided and are connected to the switch means 43 and cables 41 in the manner illustrated schematically in FIG. 4.

Another modified form of the battery testing apparatus is illustrated in the schematic circuit diagram of FIG. 5 and basically corresponds to the modified form shown in FIGS. 2 and 4 except in that one of the circuit breakers is omitted and a variable resistor is provided instead of a fixed resistor. The elimination of the second circuit breaker permits further cost savings in production of the apparatus. As indicated generally at 50, the battery testing apparatus includes cables 51, a variable load resistor 52, and a lamp 53 that are connected as shown schematically. The switch means 54 comprises a single circuit breaker, and the terminals 55 and 56 of the circuit breaker are connected respectively to one cable 51 and one end of the load resistor 52. The other cable 51 and the other end of the load resistor 52 are directly connected together so that the series circuit runs sequentially through one cable, the switch means 54, the load resistor, and the other cable.

The battery testing apparatus of FIG. 5 may be used with a fixed load resistor in essentially the same manner as described with respect to FIG. 3. However, when testing various storage batteries having amperage ratings that vary over a wide range, for example ranging from a low amperage rating for motorcycle batteries to a high amperage rating for marine batteries, it may be desirable to utilize the variable resistor 52, in place of the fixed load resistor 21. The variable resistor permits the operator of the battery testing apparatus to increase or decrease the resistance in the load circuit so as to control the current passing through the load circuit and the duration of the test. Thus, when testing a battery having a low amperage rating, further protection from excessive test duration can be provided by setting the variable resistor at a low resistance to cause discharge of a higher current. Similarly, the testing of a battery having a relatively high amperage rating is made more accurate by setting the variable resistor 52 at a relatively high resistance so as to effect discharge of a lower current. It can thus be seen that by providing a variable resistor in a test load circuit, the duration of the test of the batteries can be shortened or lengthened by adjusting the variable resistor to accommodate various amperage ratings of different batteries to be tested.

The battery testing apparatus in FIG. 6, indicated generally at 60 basically corresponds to the form of the invention illustrated in FIGS. 1 and 3 except in the provision of a voltmeter 65 for the voltage indicator means. With the voltmeter 65, the battery testing apparatus 60 can be used to determine the voltage of the batteries and their charge capacities with greater accuracy. Referring to the details of this modified form of FIG. 6, it is seen that there is included cables 61, switch means 62, load resistor 63, and ammeter 64 that are connected as shown schematically. The voltmeter 65 is responsive to voltages within the range of voltages of the storage batteries to be tested and is connected in parallel to the load circuit, in the manner of the lamp 31 in the form of the invention shown in FIGS. 1 and 3. The voltmeter 65 includes a scale or dial, not shown, for indicating acceptable and nonacceptable voltage levels of the battery being tested.

The modified form of the battery testing apparatus in FIG. 7 and indicated generally at 70 basically corresponds to the modified form shown in FIG. 5 except in the provision of a bell, buzzer or other audible signal means 75 serving as the voltage indicator means. Also, resistor 73 thereof is shown in the form of a fixed load resistor. The audible signal means 75 produces an audible signal when a voltage in excess of a predetermined level is detected, thereby obviating the need for visual observation of the testing apparatus 70 during operation. The predetermined voltage level of the audible signal means 75 is generally selected so that a "good" battery will produce the signal when tested. As shown schematically, cables 71, switch means 72, load resistor 73, and signal means 75 may be arranged in the circuit of FIG. 7 substantially in the manner of the elements 51, 54, 52, 53, respectively, in FIG. 5.

In the drawings and specification, there has been set forth preferred embodiments of the invention, and although specific terms are employed, they are used in a generic and descriptive sense only and not for purposes of limitation.

That which is claimed is:

1. A battery testing apparatus for evaluating the charge capacity of a storage battery under no-load and load conditions while limiting the duration of the test and protecting both the testing apparatus and battery from excessive and potentially harmful current being drawn from the battery during the test, and comprising
   cable means adapted to be connected to the electrodes of the storage battery,
   voltage indicator means electrically connected to said cable means and operable for detecting the voltage available between the electrodes of the battery,
   a load circuit including a load resistor connected in parallel with said voltage indicator means and switch means connected in series with said load resistor and positionable between open and closed states so that the relative magnitude of the voltage of the battery under a no-load condition can be determined when said switch means is open and the relative magnitude of the voltage of the battery under a load condition can be determined when said switch means is closed,
   and said switch means comprising current responsive means which will open in response to the passage of current of a magnitude exceeding a predetermined amperage rating, the predetermined amperage rating of said current responsive means being correlated to the resistance of said load resistor and to a predetermined acceptable level of battery capability such that a battery undergoing testing and having a capability at or above said predetermined acceptable level will result in a current in the load circuit exceeding said predetermined amperage rating of the current responsive means, thereby opening said load circuit and protecting the battery and the testing apparatus from excessive current.

2. A battery testing apparatus for evaluating the charge capacity of a storage battery under no-load and load conditions and comprising
   a housing comprising a pair of circuit breakers mounted in side-by-side relationship, each circuit breaker having first and second terminals and a current responsive switch electrically connected to said terminals, each said current responsive switch including a manually actuable lever to prevent manually positioning the switch between open and closed states,
   respective cables electrically connected to one of the terminals of each of said circuit breakers, said cables being adapted to be connected to the electrodes of the storage battery,
   voltage indicator means electrically connected to said cables and operable for detecting the voltage available between the electrodes of the battery,
   a metallic generally U-shaped handle having a pair of end portions connected respectively to the other of said terminals of said pair of circuit breakers whereby said handle also serves as a load resistor connected in parallel with said voltage indicator means so that the relative magnitude of the voltage of the battery under a no-load condition can be determined when at least one of said current responsive switches is in an open state and the relative magnitude of the voltage of the battery under a load condition can be determined when at least one of said current responsive switches is in a closed state.

3. An apparatus as defined in claim 2 additionally including means interconnecting the manually actuable levers of said circuit breakers for simultaneous movement between said open and closed states.

4. An apparatus as defined in claim 2 wherein said metallic handle comprises metallic tubing.

5. An apparatus as defined in claim 2 wherein each of said circuit breakers has a predetermined amperage rating correlated to the resistance of said load resistor and to a predetermined acceptable level of battery capability such that a battery undergoing testing and having a capability at or above such predetermined acceptable level will result in a current in the circuit breakers exceeding said predetermined amperage rating thereof, thereby opening at least one of the circuit breakers and protecting the battery and the testing apparatus from excessive current.

6. An apparatus as defined in claim 1 wherein said voltage indicator means comprises a lamp adapted to emit light proportionately to the voltage supplied by the battery.

7. An apparatus as defined in claim 1 wherein said voltage indicator means comprises a voltmeter having a scale for indicating the relative magnitude of the voltage of the battery under no-load and load conditions.

8. An apparatus as defined in claim 1 wherein said voltage indicator means comprises means for producing an audible signal when the voltage supplied by the battery exceeds a predetermined level.

9. An apparatus as defined in claim 1 wherein said current responsive means comprises at least one circuit breaker having a predetermined reaction time when its predetermined amperage rating is exceeded by current passing therethrough for automatically opening said load circuit when the current passing therethrough exceeds said amperage rating for the duration of said reaction time, whereby the duration of the test of a battery having a charge capacity at or above said predetermined level will be limited to the reaction time of said circuit breaker.

10. An apparatus as defined in claim 1 wherein said current responsive means comprises a pair of circuit breakers connected in said load circuit on opposite sides of said load resistor, each circuit breaker having a predetermined reaction time when its predetermined amperage rating is exceeded by current passing therethrough for automatically opening said load circuit when the current passing therethrough exceeds said amperage rating for the duration of said reaction time, whereby the duration of the test of a battery having a charge capacity at or above said predetermined level will be limited to the reaction time of either of the circuit breakers and said circuit breakers will serve as back-ups for each other in the event of failure of one of the circuit breakers to open said load circuit at the end of the reaction times.

11. An apparatus as defined in claim 1 wherein said load circuit further includes an ammeter connected in series with said load resistor and said switch means for measuring the current passing through said load circuit.

* * * * *